(12) United States Patent
Shinjo et al.

(10) Patent No.: US 9,343,324 B2
(45) Date of Patent: May 17, 2016

(54) RESIST UNDERLAYER FILM-FORMING COMPOSITION WHICH CONTAINS ALICYCLIC SKELETON-CONTAINING CARBAZOLE RESIN

(75) Inventors: Tetsuya Shinjo, Toyama (JP); Yasunobu Someya, Toyama (JP); Keisuke Hashimoto, Toyama (JP); Ryo Karasawa, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/131,011

(22) PCT Filed: Jul. 5, 2012

(86) PCT No.: PCT/JP2012/067201
§ 371 (c)(1),
(2), (4) Date: Feb. 26, 2014

(87) PCT Pub. No.: WO2013/005797
PCT Pub. Date: Jan. 10, 2013

(65) Prior Publication Data
US 2014/0235060 A1 Aug. 21, 2014

(30) Foreign Application Priority Data

Jul. 7, 2011 (JP) .................. 2011-150766

(51) Int. Cl.
| G03F 7/004 | (2006.01) |
| H01L 21/308 | (2006.01) |
| G03F 7/40 | (2006.01) |
| G03F 7/32 | (2006.01) |
| G03F 7/38 | (2006.01) |
| C08F 26/12 | (2006.01) |
| C08F 226/06 | (2006.01) |
| H01L 21/306 | (2006.01) |
| G03F 7/11 | (2006.01) |
| C08G 61/12 | (2006.01) |
| G03F 7/09 | (2006.01) |
| H01L 21/027 | (2006.01) |

(52) U.S. Cl.
CPC ............ *H01L 21/3081* (2013.01); *C08F 26/12* (2013.01); *C08F 226/06* (2013.01); *C08G 61/124* (2013.01); *G03F 7/091* (2013.01); *G03F 7/094* (2013.01); *G03F 7/11* (2013.01); *G03F 7/32* (2013.01); *G03F 7/38* (2013.01); *G03F 7/40* (2013.01); *H01L 21/0271* (2013.01); *H01L 21/30604* (2013.01); *C08G 2261/3241* (2013.01); *C08G 2261/3325* (2013.01)

(58) Field of Classification Search
CPC ............ G03F 7/091; G03F 7/20; G03F 7/26; G03F 7/32; G03F 7/38; G03F 7/40; C08F 26/12; C08F 226/06; C08F 2261/3241; C08F 2261/3325; H01L 21/0271; H01L 21/0273; H01L 21/0274; H01L 21/033; H01L 21/0381; H01L 21/30604
USPC ............ 430/270.1, 311, 313, 314, 317, 322, 430/325, 329, 330, 331, 913, 927; 438/703, 438/781, 705; 525/540; 526/281, 259, 263, 526/284, 323.2
See application file for complete search history.

(56) References Cited

U.S. PATENT DOCUMENTS

| 4,924,601 | A | * | 5/1990 | Bercaw ........................... 34/530 |
| 5,135,673 | A | * | 8/1992 | Murata et al. .............. 252/62.54 |
| 6,235,856 | B1 | * | 5/2001 | Hafner et al. ................. 526/171 |
| 6,503,689 | B2 | * | 1/2003 | Zampini et al. ............. 430/270.1 |
| 7,416,833 | B2 | * | 8/2008 | Hatakeyama et al. ..... 430/270.1 |
| 7,476,485 | B2 | * | 1/2009 | Hatakeyama et al. ..... 430/270.1 |
| 7,923,129 | B2 | * | 4/2011 | Igawa et al. .................. 428/690 |
| 8,017,296 | B2 | * | 9/2011 | Houlihan et al. .......... 430/270.1 |
| 8,088,554 | B2 | * | 1/2012 | Hatakeyama .............. 430/270.1 |

(Continued)

FOREIGN PATENT DOCUMENTS

| JP | 2001354862 A | * | 12/2001 |
| JP | A-2004-205685 | | 7/2004 |
| JP | A-2008-96684 | | 4/2008 |
| JP | 2008174661 A | * | 7/2008 |

(Continued)

OTHER PUBLICATIONS

Rusen et al, "Grafting N-vinyl-carbazole on alterning copolymers obtained from dicyclopentadiene", Optoelectronics and Advanced Materials—Rapid communications, vol. 3, No. 3, Mar. 2009, p. 249-254.*
Machine translation of JP 2001-354862 (no date).*
Jul. 31, 2012 International Search Report issued in International Patent Application No. PCT/JP2012/067201.
Jul. 31, 2012 Written Opinion issued in in International Patent Application No. PCT/JP2012/067201.

*Primary Examiner* — Amanda C Walke
(74) *Attorney, Agent, or Firm* — Oliff PLC

(57) ABSTRACT

There is provided a resist underlayer film used in lithography process that has a high n value and a low k value, and can effectively reduce reflection of light having a wavelength of 193 nm from the substrate in a three-layer process in which the resist underlayer film is used in combination with a silicon-containing intermediate layer. A resist underlayer film-forming composition used in lithography process including: a polymer containing a unit structure including a product obtained by reaction of a condensed heterocyclic compound and a bicyclo ring compound. The condensed heterocyclic compound is a carbazole compound or a substituted carbazole compound. The bicyclo ring compound is dicyclopentadiene, substituted dicyclopentadiene, tetracyclo[4.4.0.$1^{2,5}.1^{7,10}$]dodeca-3,8-diene, or substituted tetracyclo [4.4.0.$1^{2,5}.1^{7,10}$]dodeca-3,8-diene.

8 Claims, No Drawings

(56) References Cited

U.S. PATENT DOCUMENTS

| | | | |
|---|---|---|---|
| 8,674,052 B2* | 3/2014 | Saito et al. | 528/117 |
| 2007/0238052 A1* | 10/2007 | Zampini et al. | 430/311 |
| 2012/0077345 A1* | 3/2012 | Saito et al. | 438/703 |
| 2012/0142879 A1* | 6/2012 | Nakajima et al. | 526/282 |
| 2013/0122710 A1* | 5/2013 | Saito et al. | 438/703 |
| 2013/0280913 A1* | 10/2013 | Shinjo et al. | 438/694 |

FOREIGN PATENT DOCUMENTS

| | | |
|---|---|---|
| JP | 2008231419 A * | 10/2008 |
| JP | A-2010-528334 | 8/2010 |
| WO | WO 2008/142546 A2 | 11/2008 |
| WO | WO 2010/021359 A1 | 2/2010 |
| WO | WO 2010/147155 A1 | 12/2010 |

* cited by examiner

_US 9,343,324 B2_

RESIST UNDERLAYER FILM-FORMING COMPOSITION WHICH CONTAINS ALICYCLIC SKELETON-CONTAINING CARBAZOLE RESIN

TECHNICAL FIELD

The present invention relates to a resist underlayer film-forming composition for lithography that is useful in fabricating a semiconductor substrate, a resist pattern forming method using the resist underlayer film-forming composition, and a production method of a semiconductor device.

BACKGROUND ART

Conventionally, microfabrication by lithography using photoresist compositions has been performed in the production of semiconductor devices. This microfabrication is a fabrication method that includes forming a thin film of a photoresist composition on a substrate to be fabricated such as a silicon wafer, radiating active rays such as ultraviolet rays onto the thin film via a mask pattern in which a pattern of a semiconductor device is formed, developing the film, and etching the substrate to be fabricated such as a silicon wafer using the obtained photoresist pattern as a protective film. In recent years, higher integration of semiconductor devices has been pursued, and there is a trend for the active rays used to have shorter wavelengths from KrF excimer lasers (248 nm) to ArF excimer lasers (193 nm). This trend has been accompanied by significant disadvantages of effects due to standing waves and diffuse reflection of the active rays from the substrate. Accordingly, methods have been extensively studied that include providing an anti-reflective coating (Bottom Anti-Reflective Coating, BARC) between the photoresist and the substrate to be fabricated.

When a finer resist pattern is further pursued, an issue of resolution and a defective condition in which the resist pattern collapses after development may occur, and thus thinner resists is required. This makes it difficult to achieve sufficient resist pattern film thickness for fabrication of a substrate, and thus a process has become necessary in which the function of a mask during the substrate fabrication is imparted not only to the resist pattern, but also to a resist underlayer film that is formed between the resist and a semiconductor substrate to be fabricated. As a resist underlayer film for such a process, unlike a conventional resist underlayer film having a high etching-rate property (high etching rate), a resist underlayer film for lithography having a selection ratio of dry etching rate to the dry etching rate of the resist that is close to 1, a resist underlayer film for lithography having a smaller selection ratio of dry etching rate to the dry etching rate of the resist, or a resist underlayer film for lithography having a smaller selection ratio of dry etching rate to the dry etching rate of the semiconductor substrate is required.

Example of a polymer for the resist underlayer films include the following.

Resist underlayer film-forming compositions in which a carbazole novolak resin is used are exemplified (see Patent Document 1).

While such a finer resist pattern is being pursued, a three-layer process is widely used for forming a silicon-containing resist intermediate layer film and a resist underlayer film in the lower layer of the resist. There is a demand for using the intermediate layer film the film thickness of which is equal to or smaller than 50 nm from the viewpoint of pattern collapse and etching fabrication accuracy. When the film thickness of the silicon-containing intermediate layer film is equal to or smaller than 50 nm, the anti-reflection effect of the silicon-containing intermediate layer film decreases, and thus the resist underlayer film is required to have an n value and a k value that are appropriate. More specifically, an underlayer film that has a high n value, a low k value, transparency, and also high etching resistance is required.

Examples of a polymer for the resist underlayer film having an n value and a k value that are appropriate include the following.

Resist underlayer film-forming compositions in which a polymer containing a product obtained by reaction of naphthol with dicyclopentadiene is used are exemplified (see Patent Document 2).

PRIOR ART DOCUMENTS

Patent Documents

Patent Document 1: WO2010-147155
Patent Document 2: Japanese Patent Application Publication No. 2004-205685 (JP 2004-205685 A)

SUMMARY OF THE INVENTION

Problem to be Solved by the Invention

An object of the present invention is to provide a resist underlayer film-forming composition used in a lithography process of semiconductor device production. Another object of the present invention is to provide a resist underlayer film for lithography that has optimum n and k values under exposure to short-wavelength light, can provide an excellent resist pattern without occurrence of intermixing with a resist layer, and has a selection ratio of dry etching rate to the dry etching rate of the resist that is close to 1, or has a smaller selection ratio of dry etching rate to the dry etching rate of the resist, or has a smaller selection ratio of dry etching rate to the dry etching rate of the semiconductor substrate. Still another object of the present invention is to provide a method for forming the resist pattern using the resist underlayer film-forming composition. Still another object of the present invention is to provide the resist underlayer film-forming composition for forming the resist underlayer film that also has heat resistance.

Means for Solving the Problem

The present invention provides, as a first aspect, a resist underlayer film-forming composition comprising: a polymer containing a unit structure including a product obtained by reaction of a condensed heterocyclic compound and a bicyclo ring compound;

as a second aspect, the resist underlayer film-forming composition according to the first aspect, in which the condensed heterocyclic compound is a carbazole compound or a substituted carbazole compound;

as a third aspect, the resist underlayer film-forming composition according to the first aspect or the second aspect, in which the bicyclo ring compound is dicyclopentadiene, substituted dicyclopentadiene, tetracyclo[4.4.0.1$^{2,5}$.1$^{7,10}$]dodeca-3,8-diene, or substituted tetracyclo[4.4.0.1$^{2,5}$.1$^{7,10}$]dodeca-3,8-diene;

as a fourth aspect, the resist underlayer film-forming composition according to the first aspect, in which the polymer is a polymer containing a unit structure of Formula (1), a unit structure of Formula (2), a unit structure of Formula (3), or a combination of the unit structures of Formulae (1), (2), and (3):

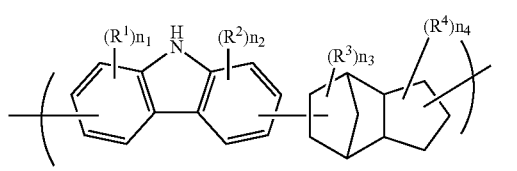

Formula (1)

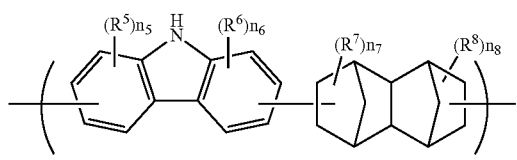

Formula (2)

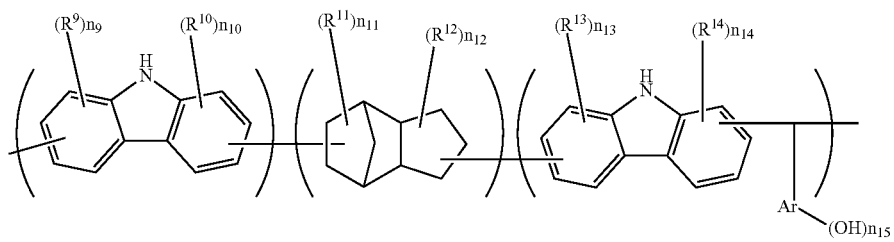

Formula (3)

(in the formulae, $R^1$ to $R^{14}$ are each a substituent of a hydrogen atom and are each independently a halogen group, a nitro group, an amino group, a hydroxy group, or a $C_{1-10}$ alkyl group for which the groups are optionally substituted or a $C_{6-40}$ aryl group for which the groups are optionally substituted; Ar is a $C_{6-10}$ aromatic ring group; each of $n_1$, $n_2$, $n_5$, $n_6$, $n_9$, $n_{10}$, $n_{13}$, $n_{14}$, and $n_{15}$ is an integer of 0 to 3; and each of $n_3$, $n_4$, $n_7$, $n_8$, $n_{11}$, and $n_{12}$ is an integer of 0 to 4);

as a fifth aspect, the resist underlayer film-forming composition according to the fourth aspect, in which in Formula (3), the Ar is a phenyl group or a naphthyl group;

as a sixth aspect, the resist underlayer film-forming composition according to any one of the first aspect to the fifth aspect, further comprising a cross-linking agent;

as a seventh aspect, the resist underlayer film-forming composition according to any one of the first aspect to the sixth aspect, further comprising an acid and/or an acid generator;

as an eighth aspect, a resist underlayer film obtained by applying the resist underlayer film-forming composition as described in any one of the first aspect to the seventh aspect onto a semiconductor substrate and baking the resist underlayer film-forming composition;

as a ninth aspect, a method for forming a resist pattern used in production of a semiconductor, the method comprising: applying the resist underlayer film-forming composition as described in any one of the first aspect to the seventh aspect onto a semiconductor substrate and baking the resist underlayer film-forming composition to form an underlayer film;

as a tenth aspect, a production method of a semiconductor device, the production method comprising: forming an underlayer film on a semiconductor substrate using the resist underlayer film-forming composition as described in any one of the first aspect to the seventh aspect; forming a resist film on the underlayer film; forming a resist pattern in the resist film by irradiation with light or electron beams and development; etching the underlayer film using the resist pattern; and fabricating the semiconductor substrate using the underlayer film thus patterned;

as an eleventh aspect, a production method of a semiconductor device, the production method comprising: forming an underlayer film on a semiconductor substrate using the resist underlayer film-forming composition as described in any one of the first aspect to the seventh aspect; forming a hard mask on the underlayer film; further forming a resist film on the hard mask; forming a resist pattern in the resist film by irradiation with light or electron beams and development; etching the hard mask using the resist pattern; etching the underlayer film using the hard mask thus patterned; and fabricating the semiconductor substrate using the underlayer film thus patterned;

as a twelfth aspect, the production method according to the eleventh aspect, in which the hard mask is formed by application of an inorganic substance solution or deposition of an inorganic substance.

Effects of the Invention

The resist underlayer film-forming composition of the present invention makes it possible to form an excellent shape of a resist pattern without occurrence of intermixing between a top layer portion of a resist underlayer film and a layer that is coated on the top layer portion.

A property of efficiently suppressing reflection of exposure light from a substrate can be imparted to the resist underlayer film-forming composition of the present invention, making it possible for the composition to also serve as an anti-reflective coating for exposure light.

A resist underlayer film obtained from the resist underlayer film-forming composition of the present invention has a high n value and a low k value, and can effectively reduce reflection of light having a wavelength of 193 nm from the substrate in a three-layer process in which the resist underlayer film is used in combination with a silicon-containing intermediate layer.

The resist underlayer film-forming composition of the present invention makes it possible to provide an excellent resist underlayer film having a selection ratio of dry etching rate to the dry etching rate of the resist that is close to 1, a smaller selection ratio of dry etching rate to the dry etching rate of the resist, or a smaller selection ratio of dry etching rate to the dry etching rate of a semiconductor substrate.

As a resist pattern becomes finer, a resist is made thinner in order to prevent the resist pattern from collapsing after development. For such a thin film resist, there are a process that includes transferring a resist pattern onto an underlayer film thereof in an etching process to fabricate a substrate using the underlayer film as a mask, and also a process that includes repeating steps of transferring a resist pattern onto an underlayer film in an etching process and further transferring the pattern transferred on the underlayer film onto an underlayer film thereof using a different gas composition to finally fabricate a substrate. The resist underlayer film and the composition for forming the resist underlayer film of the present invention are effective for such processes and, when a substrate is fabricated with the resist underlayer film of the present invention, exhibit sufficient etching resistance for the fabricated substrate (e.g., a thermal silicon oxide film, a silicon nitride film, or a polysilicon film on the substrate).

The resist underlayer film of the present invention can be used as a planarizing film, a resist underlayer film, an anti-fouling film for resist layers, or a film having dry etching selectivity. This makes it possible to form a resist pattern easily and precisely in a lithography process of semiconductor production.

There is a process that includes: forming a resist underlayer film on a substrate using the resist underlayer film-forming composition of the present invention; forming a hard mask thereon; forming a resist film thereon; forming a resist pattern by exposure and development; transferring the resist pattern onto the hard mask; transferring the resist pattern transferred on the hard mask to the resist underlayer film; and fabricating the semiconductor substrate using the resultant resist underlayer film. In this process, the hard mask may be formed out of a coating-type composition that contains an organic polymer and/or an inorganic polymer and a solvent, or may be formed by vacuum deposition of an inorganic substance. The inorganic substance (e.g., silicon oxynitride) forms a deposit on the surface of the resist underlayer film upon vacuum deposition, during which the temperature of the resist underlayer film surface rises to about 400° C. Because the polymer used in the present invention is a polymer containing a carbazole novolak-based unit structure having high heat resistance, the resist underlayer film of the present invention has very high heat resistance, and does not undergo thermal degradation even through deposition of deposits.

MODES FOR CARRYING OUT THE INVENTION

The present invention provides a resist underlayer film-forming composition that is used in a lithography step and contains a polymer containing a unit structure containing a product obtained by reaction of a condensed heterocyclic compound and a bicyclo ring compound.

The resist underlayer film-forming composition for lithography contains the polymer and a solvent in the present invention. This composition may contain a cross-linking agent and an acid, and may contain an additive such as an acid generator or a surfactant as necessary. The solid content of the composition is 0.1 to 70% by mass or 0.1 to 60% by mass. The solid content is the content percentage of all components of the resist underlayer film-forming composition excluding the solvent. The solid content may contain the polymer at a proportion of 1 to 100% by mass, 1 to 99.9% by mass, 50 to 99.9% by mass, 50 to 95% by mass, or 50 to 90% by mass.

The polymer used in the present invention has a weight-average molecular weight of 600 to 1,000,000 or 600 to 200,000.

In the polymer, the condensed heterocyclic compound may be carbazole or substituted carbazole. The bicyclo ring compound may be dicyclopentadiene, substituted dicyclopentadiene, tetracyclo[4.4.0.1$^{2,5}$.1$^{7,10}$]dodeca-3,8-diene, or substituted tetracyclo[4.4.0.1$^{2,5}$.1$^{7,10}$]dodeca-3,8-diene.

The polymer may contain a unit structure of Formula (1), a unit structure of Formula (2), a unit structure of Formula (3), or a combination thereof.

In the formulae, $R^1$ to $R^{14}$ are each a substituent of a hydrogen atom and are each independently a halogen group, a nitro group, an amino group, a hydroxy group, or a $C_{1-10}$ alkyl group or a $C_{6-40}$ aryl group for which the groups are optionally substituted; Ar is a $C_{6-40}$ aromatic ring group; each of $n_1$, $n_2$, $n_5$, $n_6$, $n_9$, $n_{10}$, $n_{13}$, $n_{14}$, and $n_{15}$ is an integer of 0 to 3; and each of $n_3$, $n_4$, $n_7$, $n_8$, $n_{11}$, and $n_{12}$ is an integer of 0 to 4.

Examples of the halogen group include a fluorine atom, a chlorine atom, a bromine atom, and an iodine atom.

Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{6-40}$ aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

When each of $R^1$, $R^2$, $R^5$, $R^6$, $R^9$, $R^{10}$, $R^{13}$, and $R^{14}$ is a hydrogen atom, each of $n_1$, $n_2$, $n_5$, $n_6$, $n_9$, $n_{10}$, $n_{13}$, and $n_{14}$ is zero. When each of $R^3$, $R^4$, $R^7$, $R^8$, $R^{11}$, and $R^{12}$ is a hydrogen atom, each of $n_3$, $n_4$, $n_7$, $n_8$, $n_{11}$, and $n_{12}$ is zero. When either one or both of $R^3$ and $R^4$ are hydroxy groups, each of $n_3$ and $n_4$ is zero or one. When either one or both of $R^7$ and $R^8$ are hydroxy groups, each of $n_7$ and $n_8$ is zero or one.

Examples of carbazoles that are used in the present invention include carbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxaldehyde, 9-benzylcarbazole-3-carboxaldehyde, 9-methylcarbazole, 9-phenylcarbazole, 9-vinylcarbazole, carbazole potassium, carbazole-N-carbonyl chloride, N-ethylcarbazole-3-carboxaldehyde, and N-((9-ethylcarbazol-3-yl)methylene)-2-methyl-1-indolynyl amine. These carbazoles may be used singly or in combination of two or more of them.

The polymers having the unit structure of Formula (1) and Formula (2) can be obtained by subjecting dicyclopentadienes and carbazoles to addition reaction in the presence of an acid catalyst. Examples of the acid catalyst used for the reaction include Lewis acids such as an ethanol complex of boron trifluoride and aluminum chloride; inorganic acids such as hydrochloric acid, nitric acid, and sulfuric acid; sulfonic acids such as methanesulfonic acid, n-butanesulfonic acid, benzenesulfonic acid, p-toluenesulfonic acid, m-xylenesulfonic acid, p-xylenesulfonic acid, and mesitylenesulfonic acid; super strong acids like perfluorosulfonic acids such as trifluoromethanesulfonic acid, nonafluoromethanesulfonic acid, and pentafluorobenzenesulfonic acid; anion exchange resins such as a perfluoroalkyl polymer having a terminal sulfonic acid group such as Nafion and polystyrene having a sulfonic acid residue.

Methanesulfonic acid, a tosylic acid, and trifluoromethanesulfonic acid can be preferably used in particular. Catalysts manufactured by King Industries, Inc. in the United States, trade name K-PURE-TAG-2689, trade name K-PURE-TAG-2690, trade name K-PURE-CXC-1614, and trade name K-PURE-CXC-1615, may also be used.

The amount of usage thereof ranges from 0.01 to 5 mol % with respect to the raw material monomer. For example, the amount ranges from 0.01 to 10 mol % and preferably from 0.05 to 5 mol % for a methanesulfonic acid-based catalyst, and ranges from 0.0001 to 5 mol % and preferably from 0.0005 to 5 mol % for a trifluoromethanesulfonic acid-based catalyst with respect to the raw material monomer.

Examples of the solvent used for producing the polymer of the present invention include: ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol monomethyl ether acetate, and propylene glycol mono-tert-butyl ether acetate; toluene; butyl cellosolve; and 1,4-dioxane. These solvents may be used singly or in combination of two or more of them. The reaction temperature is generally 40° C. to 200° C. The reaction time is selected differently depending on the reaction temperature, and is generally about 30 minutes to 50 hours.

The weight-average molecular weight Mw of polymers obtained as described above is generally 600 to 1,000,000 or 600 to 200,000.

The polymer containing the unit structure of Formula (1), the unit structure of Formula (2), or the combination thereof can be exemplified as follows.

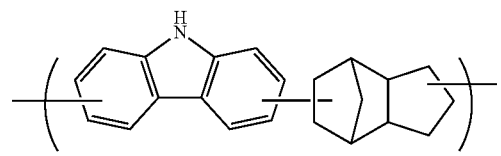

Formula (3-1)

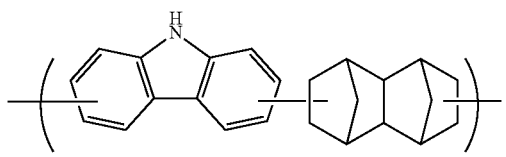

Formula (3-2)

The condensed heterocyclic compound, the bicyclo ring compound, and hydroxydicyclopentadiene can be copolymerized. For example, carbazole, dicyclopentadiene, and hydroxydicyclopentadiene can be copolymerized. In this case, the resultant copolymer is considered to have a structure in which hydroxydicyclopentadiene is added to the end of a copolymer of carbazole and dicyclopentadiene.

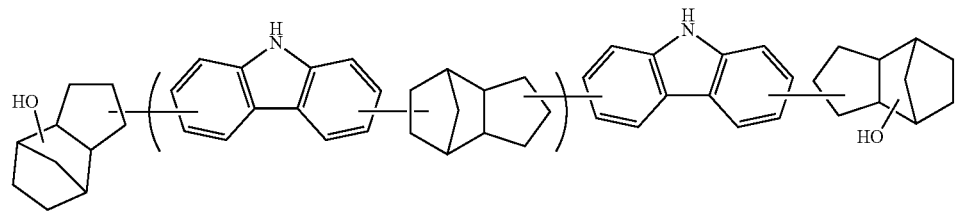

Formula (3-3)

Furthermore, the condensed heterocyclic compound, the bicyclo ring compound, and an aromatic compound having a hydroxy group and an aldehyde group can be copolymerized.

For example, carbazole, dicyclopentadiene, and an aromatic compound having a hydroxy group and an aldehyde group can be copolymerized. An aromatic compound having a hydroxy group and an aldehyde group has an effect of increasing the solubility of a polymer because the aromatic compound binds to the polymer. Accordingly, some substituents binding to carbazole and dicyclopentadiene make it possible to solve a problem that sufficient solubility of the polymer in the solvents is not obtained. The carbazole, the dicyclopentadiene, and the aromatic compound having a hydroxy group and an aldehyde group are copolymerized through condensation reaction in the presence of an acid.

Examples of the aromatic compound having a hydroxy group and an aldehyde group include salicylaldehyde, 3-hydroxybenzaldehyde, 4-hydroxybenzaldehyde, 2,3-dihydroxybenzaldehyde, 3,4-dihydroxybenzaldehyde, 2,4-dihydroxybenzaldehyde, 3,5-dihydroxybenzaldehyde, 2,3,4-trihydroxybenzaldehyde, 2,4,5-trihydroxybenzaldehyde, 2,4,6-trihydroxybenzaldehyde, 3,4,5-trihydroxybenzaldehyde, 1-hydroxy-2-naphthylaldehyde, 3-hydroxy-2-naphthylaldehyde, 2-hydroxy-1-naphthylaldehyde, 4-hydroxy-1-naphthylaldehyde, 6-hydroxy-2-naphthylaldehyde, and 2,6-dihydroxy-1-naphthylaldehyde.

The polymer can be used, mixed with other polymers at a content of 30% by mass or less in the total polymers.

Examples of the other polymers include polyacrylic acid ester compounds, polymethacrylic acid ester compounds, polyacrylamide compounds, polymethacrylamide compounds, polyvinyl compounds, polystyrene compounds, polymaleimide compounds, polymaleic acid anhydride, and polyacrylonitrile compounds.

Examples of raw material monomers of the polyacrylic acid ester compounds include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of raw material monomers of the polymethacrylic acid ester compounds include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, iso-decyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxy-norbornene-2-carboxylic-6-lactone, and 2,2,3,3,4,4-heptafluorobutyl methacrylate.

Examples of acrylamide compounds include acrylamide, N-methyl acrylamide, N-ethyl acrylamide, N-benzyl acrylamide, N-phenyl acrylamide, and N,N-dimethyl acrylamide.

Examples of raw material monomers of polymethacrylic acid amide compounds include methacrylamide, N-methyl methacrylamide, N-ethyl methacrylamide, N-benzyl methacrylamide, N-phenyl methacrylamide, and N,N-dimethyl methacrylamide.

Examples of raw material monomers of the polyvinyl compounds include vinyl ether, methyl vinyl ether, benzylvinyl ether, 2-hydroxyethylvinyl ether, phenylvinyl ether, and propylvinyl ether.

Examples of raw material monomers of the polystyrene compounds include styrene, methylstyrene, chlorostyrene, bromostyrene, and hydroxystyrene.

Examples of raw material monomers of the polymaleimide compounds include maleimide, N-methylmaleimide, N-phenylmaleimide, and N-cyclohexylmaleimide.

These polymers can be produced by dissolving, in an organic solvent, addition-polymerizable monomers and a chain transfer agent (10% or less with respect to the mass of monomers) that is added as necessary, then adding a polymerization initiator to perform polymerization reaction, and adding a polymerization terminator to terminate the reaction. The addition amount of the polymerization initiator is 1 to 10% with respect to the mass of monomers, and the addition amount of the polymerization terminator is 0.01 to 0.2% by mass with respect to the mass of monomers. Examples of the organic solvent used include propylene glycol monomethyl ether, propylene glycol monopropyl ether, ethyl lactate, cyclohexanone, methyl ethyl ketone, or dimethylformamide. Examples of the chain transfer agent include dodecanethiol and dodecylthiol. Examples of the polymerization initiator include azobisisobutyronitrile and azobiscyclohexanecarbonitrile. Examples of the polymerization terminator include 4-methoxyphenol. The reaction temperature is appropriately selected from a range from 30 to 100° C., and the reaction time is appropriately selected from a range from 1 to 48 hours.

The resist underlayer film-forming composition of the present invention can contain a cross-linking agent component. Examples of the cross-linking agent include melamine-based agents, substituted urea-based agents, and polymer-based agents of them. Preferred cross-linking agents have at least two cross-link forming substituents, and examples of the cross-linking agents include compounds including methoxymethylated glycoluril such as tetramethoxymethylglycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Condensation products of these compounds can also be used.

A cross-linking agent having high heat resistance can be used as the cross-linking agent. As the cross-linking agent having high heat resistance, a compound containing a cross-link forming substituent having an aromatic ring (e.g., a benzene ring or a naphthalene ring) in the molecule can be preferably used.

Examples of this compound include compounds having a partial structure of Formula (4) below, and polymers or oligomers having a repeating unit of Formula (5) below.

In Formula (4), $R^{16}$ and $R^{17}$ are each a hydrogen atom, a $C_{1-10}$ alkyl group, or a $C_{6-20}$ aryl group; $n_{16}$ is an integer of 1 to 4; $n_{17}$ is an integer of 1 to (5-$n_{16}$); and ($n_{16}$+$n_{17}$) is an integer of 2 to 6.

In formula (5), $R^{18}$ is a hydrogen atom or a $C_{1-10}$ alkyl group; $R^{19}$ is a $C_{1-10}$ alkyl group; $n_{18}$ is an integer of 1 to 4; $n_{19}$ is 0 to $(4-n_{18})$; and $(n_{18}+n_{19})$ is an integer of 1 to 4. Oligomers and polymers the number of repeating unit structures of which is in a range of 2 to 100 or 2 to 50 can be used.

The alkyl group and the aryl group herein can be exemplified by the alkyl groups and the aryl groups described above.

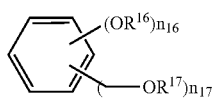

Formula (4)

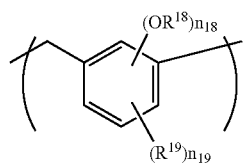

Formula (5)

The compounds having the partial structure of Formula (4) are exemplified as follows.

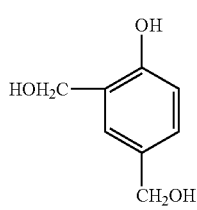

Formula (4-1)

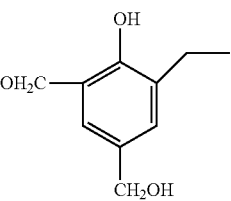

Formula (4-2)

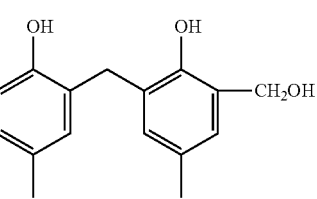

Formula (4-3)

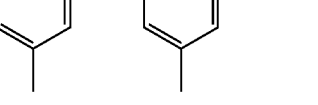

Formula (4-4)

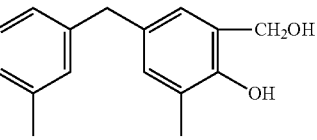

Formula (4-5)

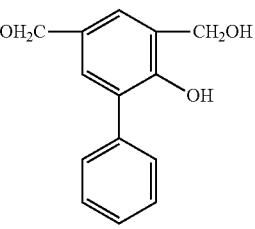

-continued

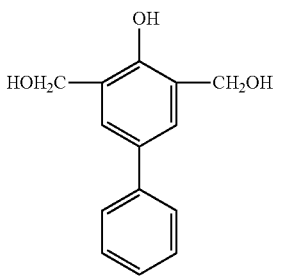

Formula (4-6)

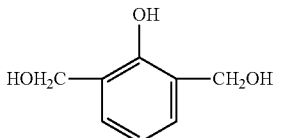

Formula (4-7)

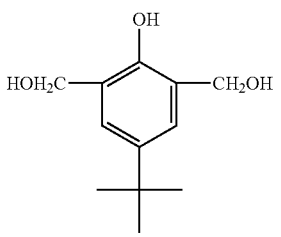

Formula (4-8)

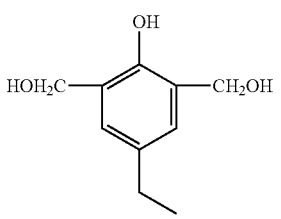

Formula (4-9)

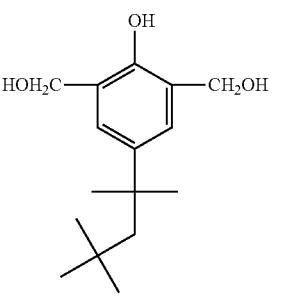

Formula (4-10)

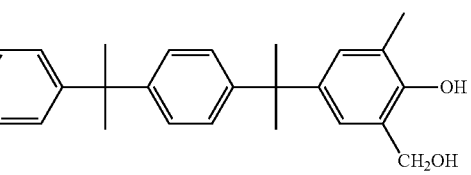

Formula (4-11)

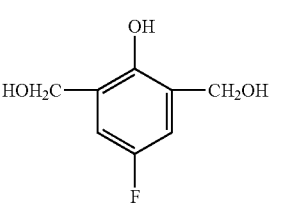

Formula (4-12)

Formula (4-13)
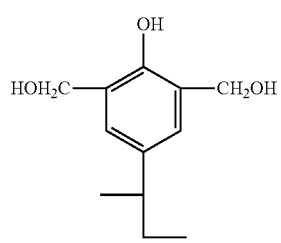
Formula (4-14)
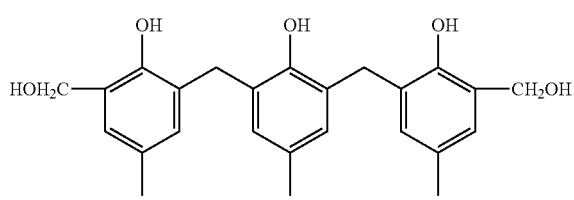
Formula (4-15)
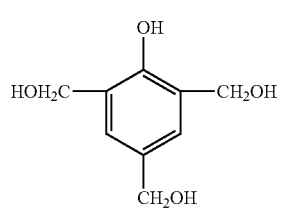
Formula (4-16)
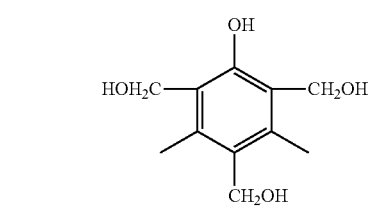
Formula (4-17)
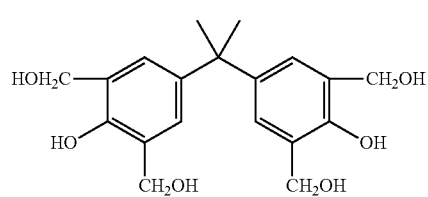
Formula (4-18)
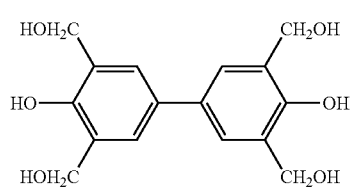
Formula (4-19)
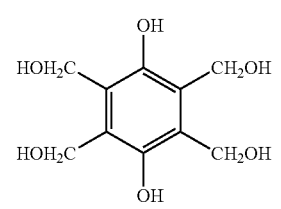
Formula (4-20)
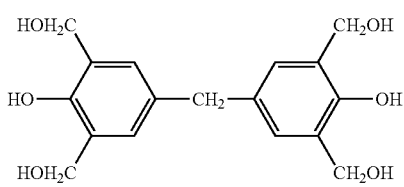
Formula (4-21)
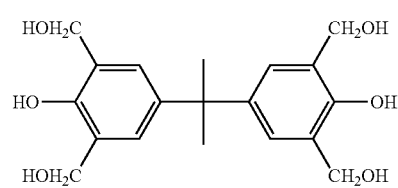
Formula (4-22)
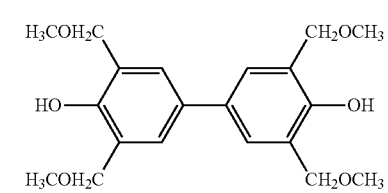
Formula (4-23)
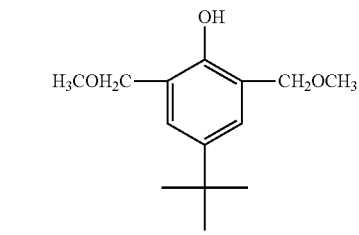
Formula (4-24)
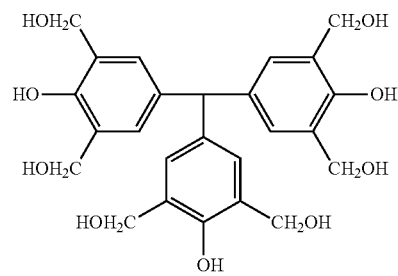
Formula (4-25)
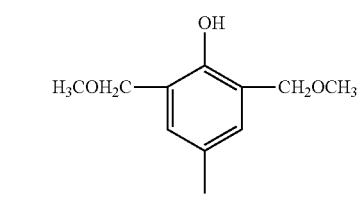
Formula (4-26)
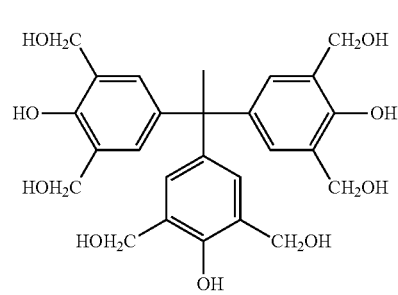

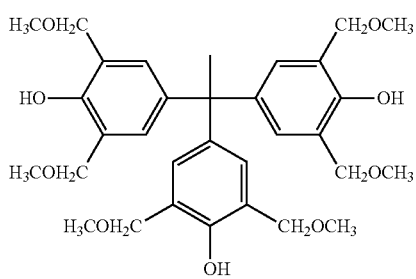

Formula (4-27)

These compounds are available as products of Asahi Organic Chemicals Industry Co., Ltd. and Honshu Chemical Industry Co., Ltd. For example, the compound of Formula (4-21) among the cross-linking agents is available under the trade name of TM-BIP-A from Asahi Organic Chemicals Industry Co., Ltd.

The addition amount of the cross-linking agent depends on a solvent used for application, an underlying substrate used, a solution viscosity required, and a film shape required, for example, and is 0.001 to 80% by mass, preferably 0.01 to 50% by mass, and more preferably 0.05 to 40% by mass with respect to the total solid contents. These cross-linking agents may cause cross-linking reaction by self-condensation but, when a cross-linkable substituent exists in the polymer of the present invention, the cross-linking agents can cause cross-linking reaction with the cross-linkable substituent.

In the present invention, as a catalyst for promoting the cross-linking reaction, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, or naphthalenecarboxylic acid; and/or a thermal acid generator such as 2,4,4,6-tetrabromocyclohexadienone, benzoin tosylate, 2-nitrobenzyl tosylate, or other organic sulfonic acid alkyl esters can be blended. The blending amount of the catalyst is 0.0001 to 20% by mass, preferably 0.0005 to 10% by mass, and preferably 0.01 to 3% by mass with respect to the total solid contents.

A photoacid generator can be added to the coating-type resist underlayer film-forming composition for lithography of the present invention in order to match the acidity with that of a photoresist that is coated on the upper layer in a lithography step. Examples of the photoacid generator preferred include onium salt-based photoacid generators such as bis(4-t-butylphenyl)iodonium trifluoromethanesulfonate and triphenyl sulfonium trifluoromethanesulfonate; halogen-containing compound-based photoacid generators such as phenyl-bis(trichloromethyl)-s-triazine; and sulfonic acid-based photoacid generators such as benzoin tosylate and N-hydroxysuccinimide trifluoromethanesulfonate. The addition amount of the photoacid generator is 0.2 to 10% by mass, and preferably 0.4 to 5% by mass with respect to the total solid contents.

A light absorber, a rheology control agent, an adhesion assistant, and a surfactant, for example, other than the agents above can be further added as necessary to the resist underlayer film-forming composition for lithography of the present invention.

Examples of such an additional light absorber include commercially available light absorbers described in "Kogyo-yo Shikiso no Gijutsu to Shijo (Technology and Market of Industrial Dyes)" (CMC Publishing Co., Ltd.) or "Senryo Binran (Handbook for Dyes)" (edited by The Society of Synthetic Organic Chemistry, Japan). For example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 can be suitably used. These light absorbers are generally blended in a proportion of 10% by mass or less, and preferably 5% by mass or less, with respect to the total solid contents of the resist underlayer film-forming composition of resist for lithography.

The rheology control agent is added mainly for the purpose of improving the flowability of the resist underlayer film-forming composition and, particularly in a baking step, improving the film thickness uniformity of the resist underlayer film and enhancing the filling ability of the resist underlayer film-forming composition into holes. Specific examples of the rheology control agent include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; or stearic acid derivatives such as n-butyl stearate, and glyceryl stearate. These rheology control agents are generally blended in a proportion smaller than 30% by mass with respect to the total solid contents of the resist underlayer film-forming composition for lithography.

The adhesion assistant is added mainly for the purpose of improving the adhesiveness between the substrate or the resist and the resist underlayer film of the present invention, and particularly preventing the resist from peeling off during development. Specific examples of the adhesion assistant include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; urea such as 1,1-dimethylurea and 1,3-dimethylurea; and thiourea compounds. These adhesion assistants are generally blended in a proportion smaller than 5% by mass, and preferably smaller than 2% by mass with respect to the total solid contents of the resist underlayer film-forming composition for lithography.

A surfactant can be blended into the resist underlayer film-forming composition for lithography of the present invention in order to further improve coating properties against surface irregularities without occurrence of pinholes or striations, for example. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether;

polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine based surfactants including EFTOP EF301, EF303, EF352 (manufactured by Tohkem Products Corp., trade names), MEGAFAC F171, F173, R-30 (manufactured by Dainippon Ink and Chemicals, Inc., trade names), FLUORAD FC430, FC431 (manufactured by Sumitomo 3M Ltd., trade names), ASAHI GUARD AG710, and SURFLON S-382, SC101, SC102, SC103, SC104, SC105, SC106 (manufactured by Asahi Glass Co., Ltd., trade names); and an organosiloxane polymer KP341 (manufactured by Shin-Etsu Chemical Co., Ltd.). The blending amount of these surfactants is generally 2.0% by mass or less, and preferably 1.0% by mass or less with respect to the total solid contents of the resist underlayer film-forming composition for lithography of the present invention. These surfactants may be added singly or may be added in combination of two or more of them.

In the present invention, examples of usable solvents that dissolve the polymers, the cross-linking agent components, and the cross-linking catalysts include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents are used singly or in combination of two or more of them.

High-boiling point solvents such as propylene glycol monobutyl ether and propylene glycol monobutyl ether acetate can be mixed to be used. Among these solvents, propylene glycol monomethyl ether, propylene glycol monomethyl ether acetate, ethyl lactate, butyl lactate, and cyclohexanone, for example, are preferable to improve leveling properties.

The resist used in the present invention is a photoresist or an electron beam resist.

As the photoresist that is applied onto the resist underlayer film for lithography of the present invention, both a positive photoresist and a negative photoresist can be used. The photoresist may be, for example, a positive photoresist including a novolak resin and 1,2-naphthoquinone diazide sulfonic acid ester; a chemically amplified photoresist including a photoacid generator and a binder having a group that is decomposed by an acid to increase the alkali dissolution rate; a chemically amplified photoresist including an alkali-soluble binder, a low molecular compound that is decomposed by an acid to increase the alkali dissolution rate of the photoresist, and a photoacid generator; a chemically amplified photoresist including a binder having a group that is decomposed by an acid to increase the alkali dissolution rate, a low molecular compound that is decomposed by an acid to increase the alkali dissolution rate of the photoresist, and a photoacid generator; or a photoresist including an Si atom in the skeleton. Examples of the photoresist include a trade name of APEX-E manufactured by Rohm and Haas Co.

Examples of the electron beam resist applied onto the resist underlayer film for lithography of the present invention include a composition made up of a resin that includes an Si—Si bond in a main chain and includes an aromatic ring at an end and of an acid generator that generates an acid by irradiation with electron beams; and a composition made up of a poly(p-hydroxystyrene) in which an organic group containing N-carboxyamine is substituted for a hydroxy group and of an acid generator that generates an acid by irradiation with electron beams. In the latter electron beam resist composition, the acid generated from the acid generator by electron beam irradiation reacts with the N-carboxyaminoxy group on a side chain of the polymer, then the polymer side chain decomposes into hydroxyl groups, and the polymer becomes alkali-soluble and dissolves in an alkaline developer to form a resist pattern. Examples of the acid generator that generates an acid by irradiation with electron beams include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts such as a triphenyl sulfonium salt and a diphenyl iodonium salt; and sulfonic acid esters such as nitrobenzyl tosylate and dinitrobenzyl tosylate.

Examples of the developer for a resist having a resist underlayer film that is formed with the resist underlayer film-forming composition for lithography of the present invention, which can be used, include aqueous solutions of alkalis including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. Alcohols such as isopropyl alcohol or a surfactant such as a nonionic surfactant can be added to these aqueous alkaline solutions in appropriate amount for use. Among these developers, the quaternary ammonium salts are preferred, and tetramethylammonium hydroxide and choline are more preferred.

The method for forming a resist pattern of the present invention will be described below. The resist underlayer film-forming composition is applied onto a substrate (e.g., a transparent substrate such as a silicon/silicon dioxide coat, a glass substrate, or an ITO substrate) that is used in the production of precision integrated circuit elements by an appropriate coating method using a spinner or a coater, for example, and then is cured by baking to prepare a coating-type resist underlayer film. The thickness of the resist underlayer film is preferred to be 0.01 to 3.0 μm. As conditions of the baking after the application, the temperature is 80 to 350° C., and the period of time is 0.5 to 120 minutes. Subsequently, a resist is applied directly onto the resist underlayer film or, as necessary, onto a film formed by applying one to several layers of coating film material onto a coating-type resist underlayer film. Light or electron beams are radiated thereon via a predetermined mask, and then development, rinsing, and drying are performed, whereby a preferable resist pattern can be obtained. Heating may be performed after irradiation with light or electron beams (post exposure baking: PEB) as necessary. The resist underlayer film is then removed by dry etching from portions where the resist was removed through development in the above-described step, and thus a desired pattern can be formed on the substrate.

The exposure light to the photoresists is actinic rays such as near-ultraviolet rays, far-ultraviolet rays, and extreme-ultraviolet rays (e.g., EUV, wavelength of 13.5 nm). For example, light having a wavelength of 248 nm (KrF laser light), 193 nm (ArF laser light), or 157 nm ($F_2$ laser light) is used. The light irradiation method is not particularly limited as long as an acid can be generated from a photo-acid generator, and, for example, the exposure amount is 1 to 2,000 mJ/cm$^2$, 10 to 1,500 mJ/cm$^2$, or 50 to 1,000 mJ/cm$^2$.

Electron beam irradiation of the electron beam resist can be performed by using an electron beam irradiation device, for example.

In the present invention, a semiconductor device can be produced through: a step of forming a resist underlayer film, using the resist underlayer film-forming composition, on a semiconductor substrate; a step of forming a resist film thereon; a step of forming a resist pattern by irradiation with light or electron beams and development; a step of etching the resist underlayer film using the resist pattern; and a step of fabricating the semiconductor substrate using the resist underlayer film patterned.

When a finer resist pattern is further pursued, an issue of resolution and a defective condition in which the resist pattern collapses after development may occur, and thus thinner resists is required. This makes it difficult to achieve sufficient resist pattern film thickness for fabrication of a substrate, and thus a process has become necessary in which the function of a mask during the substrate fabrication is imparted not only to the resist pattern, but also to a resist underlayer film that is formed between the resist and a semiconductor substrate to be fabricated. As a resist underlayer film for such a process, unlike a conventional resist underlayer film having a high etching-rate property, a resist underlayer film for lithography having a selection ratio of dry etching rate to the dry etching rate of the resist that is close to 1, a resist underlayer film for lithography having a smaller selection ratio of dry etching rate to the dry etching rate of the resist, or a resist underlayer film for lithography having a smaller selection ratio of dry etching rate to the dry etching rate of the semiconductor substrate is required. An anti-reflection property can be imparted to such a resist underlayer film, making it possible for the resist underlayer film to serve as a conventional anti-reflective coating.

To obtain fine resist patterns, a process has also begun to be used in which a resist pattern and a resist underlayer film upon dry etching of a resist underlayer film are set to be thinner than the pattern width at the time of resist development. As a resist underlayer film for such a process, unlike a conventional anti-reflective coating having a high etching-rate property, a resist underlayer film for lithography having a selection ratio of dry etching rate to the dry etching rate of the resist that is close to 1 is required. An anti-reflection property can be imparted to such a resist underlayer film, making it possible for the resist underlayer film to serve as a conventional anti-reflective coating.

In the present invention, after the resist underlayer film of the present invention is formed on a substrate, a resist can be applied directly onto the resist underlayer film or, as necessary, onto a film formed by applying one to several layers of coating film material onto the resist underlayer film. Accordingly, the substrate can be fabricated by selecting an appropriate etching gas even if the pattern width of the resist is narrow and the resist is thinly coated in order to prevent pattern collapse.

More specifically, a semiconductor device can be produced through: a step of forming the resist underlayer film on a semiconductor substrate using the resist underlayer film-forming composition; a step of forming thereon a hard mask using a coating film material that contains a silicon component, for example, or a hard mask (e.g., silicon oxynitride) by deposition; a step of further forming a resist film thereon; a step of forming a resist pattern in the resist film by irradiation with light or electron beams and development; a step of etching the hard mask using the resist pattern with a halogen-based gas; a step of etching the resist underlayer film using the hard mask patterned, with an oxygen-based gas or a hydrogen-based gas; and a step of fabricating the semiconductor substrate using the resist underlayer film patterned, with a halogen-based gas.

When the effect of the resist underlayer film of the present invention serving as an anti-reflective coating is considered, in the resist underlayer film-forming composition for lithography of the present invention, the light-absorbing moieties are incorporated in the polymer skeleton and thus no substances diffuse into the photoresist during drying by heating or during thermal curing. The light-absorbing moieties also have sufficiently high light-absorbing ability, and thus a resist underlayer film exhibiting high anti-reflection effect can be formed.

The resist underlayer film-forming composition for lithography of the present invention exhibits high thermal stability, can prevent contamination of an upper layer film caused by decomposition products during baking, and can provide a sufficient temperature margin during the baking step.

Furthermore, the resist underlayer film-forming composition for lithography of the present invention can be used as a composition for forming a film that, depending on the process conditions, has a function of preventing reflection of light and also a function of preventing interactions between the substrate and the photoresist or preventing adverse effects on the substrate caused by materials that are used in the photoresist or by substances that are generated during exposure of the photoresist to light.

EXAMPLES

Synthesis Example 1

Synthesis of High Molecular Compound [1]

Under a nitrogen atmosphere, carbazole (13.0 g, 0.078 mol, manufactured by Tokyo Chemical Industry Co., Ltd.), dicyclopentadiene (10.3 g, 0.078 mol, manufactured by Tokyo Chemical Industry Co., Ltd.), and toluene were put in a flask. A trifluoromethanesulfonic acid (0.12 g, 0.00078 mol, manufactured by Tokyo Chemical Industry Co., Ltd.) was added, stirred, and dissolved by heating up to 120° C. to start polymerization. After the mixture was allowed to sit for 21 hours to cool down to room temperature, chloroform (30 g, manufactured by Kanto Chemical Co., Inc.) was added to dilute the mixture. Insoluble substances were removed therefrom by filtration, and then the filtrate was reprecipitated in methanol (1,500 g, manufactured by Kanto Chemical Co., Inc.). The obtained precipitate was filtered, then dried in a vacuum dryer at 60° C. for 20 hours, and 11.6 g of a target high molecular compound [1] was obtained. This high molecular compound was a polymer containing the unit structure of Formula (3-1).

The high molecular compound [1] had a weight-average molecular weight Mw of 2,000 and a degree of polydispersity Mw/Mn of 2.90 measured in terms of polystyrene by GPC.

Synthesis Example 2

Synthesis of High Molecular Compound [2]

Under a nitrogen atmosphere, carbazole (15.0 g, 0.090 mol, manufactured by Tokyo Chemical Industry Co., Ltd.), dicyclopentadiene (11.3 g, 0.085 mol, manufactured by Tokyo Chemical Industry Co., Ltd.), hydroxydicyclopentadiene (0.81 g, 0.005 mol, manufactured by Tokyo Chemical Industry Co., Ltd.), and butyl cellosolve were put in a flask. A trifluoromethanesulfonic acid (0.14 g, 0.0009 mol, manufactured by Tokyo Chemical Industry Co., Ltd.) was added, stirred, and dissolved by heating up to 140° C. to start polymerization. After the mixture was allowed to sit for 9 hours to cool down to room temperature, chloroform (30 g, manufactured by Kanto Chemical Co., Inc.) was added to dilute the mixture. Insoluble substances were removed by filtration, and then the filtrate was reprecipitated in methanol (1,500 g, manufactured by Kanto Chemical Co., Inc.). The obtained precipitate was filtered, then dried in a vacuum dryer at 60° C. for 20 hours, and 18.0 g of a target high molecular compound [2] was obtained. This high molecular compound was a polymer containing the unit structure of Formula (3-3).

The high molecular compound [2] had a weight-average molecular weight Mw of 3,200 and a degree of polydispersity Mw/Mn of 2.80 measured in terms of polystyrene by GPC.

Synthesis Example 3

Synthesis of High Molecular Compound [3]

Under a nitrogen atmosphere, carbazole (4.0 g, 0.024 mol, manufactured by Tokyo Chemical Industry Co., Ltd.), tetracyclo[4.4.0.1$^{2,5}$.1$^{7,10}$]dodeca-3,8-diene (TCDE) (3.8 g, 0.024 mol), and butyl cellosolve were put in a flask. A trifluoromethanesulfonic acid (0.04 g, 0.0002 mol, manufactured by Tokyo Chemical Industry Co., Ltd.) was added, stirred, and dissolved by heating up to 140° C. to start polymerization. After the mixture was allowed to sit for 10 hours to cool down to room temperature, chloroform (30 g, manufactured by Kanto Chemical Co., Inc.) was added to dilute the mixture. Insoluble substances were removed by filtration, and then the filtrate was reprecipitated in methanol (1,500 g, manufactured by Kanto Chemical Co., Inc.). The obtained precipitate was filtered, then dried in a vacuum dryer at 60° C. for 20 hours, and 2.6 g of a target high molecular compound [3] was obtained. This high molecular compound was a polymer containing the unit structure of Formula (3-2).

The high molecular compound [3] had a weight-average molecular weight Mw of 720 and a degree of polydispersity Mw/Mn of 1.24 measured in terms of polystyrene by GPC.

Synthesis Example 4

Synthesis of High Molecular Compound [5]

Under a nitrogen atmosphere, carbazole (10.0 g, 0.060 mol, manufactured by Tokyo Chemical Industry Co., Ltd.), dicyclopentadiene (7.12 g, 0.054 mol, manufactured by Tokyo Chemical Industry Co., Ltd.), 4-hydroxybenzaldehyde (0.73 g, 0.006 mol, manufactured by Tokyo Chemical Industry Co., Ltd.), and butyl cellosolve were put in a flask. A trifluoromethanesulfonic acid (0.09 g, 0.0006 mol, manufactured by Tokyo Chemical Industry Co., Ltd.) was added, stirred, and dissolved by heating up to 150° C. to start polymerization. After the mixture was allowed to sit for 21 hours to cool down to room temperature, tetrahydrofuran (6 g, manufactured by Kanto Chemical Co., Inc.) was added to dilute the mixture. Insoluble substances were removed by filtration, and then the filtrate was reprecipitated in methanol (400 g, manufactured by Kanto Chemical Co., Inc.). The obtained precipitate was filtered, then dried in a vacuum dryer at 60° C. for 20 hours, and 9.1 g of a target high molecular compound [5] was obtained. This high molecular compound was a polymer containing the unit structure of Formula (6-2) below.

The high molecular compound [5] had a weight-average molecular weight Mw of 2,070 and a degree of polydispersity Mw/Mn of 2.57 measured in terms of polystyrene by GPC.

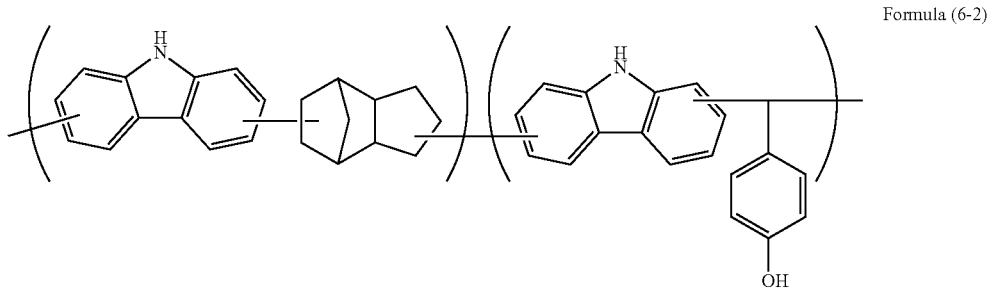

Formula (6-2)

Comparative Synthesis Example 1

Synthesis of High Molecular Compound [4]

Under a nitrogen atmosphere, carbazole (10.0 g, 0.060 mol, manufactured by Tokyo Chemical Industry Co., Ltd.), benzaldehyde (6.41 g, 0.060 mol, manufactured by Junsei Chemical Co., Ltd.), and para-toluenesulfonic acid monohydrate (1.19 g, 0.060 mol, manufactured by Kanto Chemical Co., Inc.) were added into a 100-ml four-neck flask. 1,4-dioxane (15 g, manufactured by Kanto Chemical Co., Inc.) was put therein, stirred, and dissolved by heating up to 100° C. to start polymerization. After the mixture was allowed to sit for 2 hours to cool down to 60° C., chloroform (50 g, manufactured by Kanto Chemical Co., Inc.) was added to dilute the mixture, and the mixture was reprecipitated in methanol (250 g, manufactured by Kanto Chemical Co., Inc.). The obtained precipitate was filtered, then dried in a vacuum dryer at 60° C. for 10 hours and further at 120° C. for 24 hours, and 8.64 g of a target high molecular compound [4]

was obtained. This high molecular compound was a polymer containing the unit structure of Formula (6-1) below.

The high molecular compound [4] had a weight-average molecular weight Mw of 4,000 and a degree of polydispersity Mw/Mn of 1.69 measured in terms of polystyrene by GPC.

Formula (6-1)

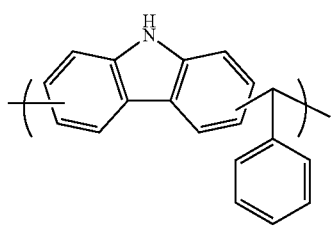

Example 1

Into 1.0 g of the high molecular compound [1] obtained in Synthesis Example 1, 0.2 g of tetramethoxymethylglycoluril, 0.02 g of pyridinium p-toluenesulfonate, 0.003 g of MEGAFAC R-30 (manufactured by Dainippon Ink and Chemicals, Inc., trade name), 2.3 g of propylene glycol monomethyl ether, 4.6 g of propylene glycol monomethyl ether acetate, and 16.3 g of cyclohexanone were mixed to make a solution. Subsequently, the solution was filtered with a polyethylene microfilter having a pore size of 0.10 µm, and further filtered with a polyethylene microfilter having a pore size of 0.05 µm to prepare a solution of a resist underlayer film-forming composition used for a lithography process using a multilayer film.

Example 2

Into 1.0 g of the high molecular compound [2] obtained in Synthesis Example 2, 0.2 g of tetramethoxymethylglycoluril, 0.02 g of pyridinium p-toluenesulfonate, 0.003 g of MEGAFAC R-30 (manufactured by Dainippon Ink and Chemicals, Inc., trade name), 2.3 g of propylene glycol monomethyl ether, 4.6 g of propylene glycol monomethyl ether acetate, and 16.3 g of cyclohexanone were mixed to make a solution. Subsequently, the solution was filtered with a polyethylene microfilter having a pore size of 0.10 µm, and further filtered with a polyethylene microfilter having a pore size of 0.05 µm to prepare a solution of a resist underlayer film-forming composition used for a lithography process using a multilayer film.

Example 3

Into 1.0 g of the high molecular compound [3] obtained in Synthesis Example 3, 0.2 g of tetramethoxymethylglycoluril, 0.02 g of pyridinium p-toluenesulfonate, 0.003 g of MEGAFAC R-30 (manufactured by Dainippon Ink and Chemicals, Inc., trade name), 2.3 g of propylene glycol monomethyl ether, 4.6 g of propylene glycol monomethyl ether acetate, and 16.3 g of cyclohexanone were mixed to make a solution. Subsequently, the solution was filtered with a polyethylene microfilter having a pore size of 0.10 µm, and further filtered with a polyethylene microfilter having a pore size of 0.05 µm to prepare a solution of a resist underlayer film-forming composition used for a lithography process using a multilayer film.

Example 4

Into 1.0 g of the high molecular compound [5] obtained in Synthesis Example 4, 0.25 g of tetramethoxymethylglycoluril, 0.02 g of pyridinium p-toluenesulfonate, 0.003 g of MEGAFAC R-30 (manufactured by Dainippon Ink and Chemicals, Inc., trade name), 2.3 g of propylene glycol monomethyl ether, 4.6 g of propylene glycol monomethyl ether acetate, and 16.3 g of cyclohexanone were mixed to make a solution. Subsequently, the solution was filtered with a polyethylene microfilter having a pore size of 0.10 µm, and further filtered with a polyethylene microfilter having a pore size of 0.05 µm to prepare a solution of a resist underlayer film-forming composition used for a lithography process using a multilayer film.

Comparative Example 1

Into 1.0 g of the high molecular compound [4] obtained in Comparative Synthesis Example 1, 0.2 g of tetramethoxymethylglycoluril, 0.02 g of pyridinium p-toluenesulfonate, 0.003 g of MEGAFAC R-30 (manufactured by Dainippon Ink and Chemicals, Inc., trade name), 2.3 g of propylene glycol monomethyl ether, 4.6 g of propylene glycol monomethyl ether acetate, and 16.3 g of cyclohexanone were mixed to make a solution. Subsequently, the solution was filtered with a polyethylene microfilter having a pore size of 0.10 µm, and further filtered with a polyethylene microfilter having a pore size of 0.05 µm to prepare a solution of a resist underlayer film-forming composition used for a lithography process using a multilayer film.

[Dissolution Test in Photoresist Solvent]

Each of the resist underlayer-film forming composition solutions prepared in Example 1 to Example 4 and Comparative Example 1 was applied onto a silicon wafer with a spinner, and heated on a hot plate at a temperature of 250° C. for 1 minute to form a resist underlayer film (film thickness: 0.2 µm). These resist underlayer films were immersed in ethyl lactate, propylene glycol monomethyl ether, and propylene glycol monomethyl ether acetate that are solvents used for a photoresist, and were found insoluble in these solvents.

[Test on Optical Parameters]

Each of the resist underlayer film-forming compositions prepared in Example 1 to Example 4 and Comparative Example 1 was applied onto a silicon wafer with a spinner, and was heated on a hot plate at a temperature of 250° C. for 1 minute to form a resist underlayer film (film thickness: 0.2 µm). The refractive index (n value) at a wavelength of 193 nm and the optical-absorption coefficient (k value, also called attenuation coefficient) of each resist underlayer film was measured by using a spectroscopic ellipsometer (manufactured by J.A. Woollam Co., Inc., VUV-VASE VU-302). The results are given in Table 1.

TABLE 1

| | 193 nm | |
|---|---|---|
| | n value | k value |
| Example 1 | 1.65 | 0.27 |
| Example 2 | 1.64 | 0.26 |
| Example 3 | 1.66 | 0.19 |
| Example 4 | 1.61 | 0.28 |
| Comparative Example 1 | 1.38 | 0.38 |

The results given in Table 1 indicate that the resist underlayer films obtained from the resist underlayer film-forming compositions according to the present invention have n values ranging from 1.6 to 1.7 and k values ranging from 0.1 to 0.3, have higher n values and lower k values than those of the resist underlayer film made of the conventional resist underlayer film-forming composition given in the comparative example, and can effectively reduce reflection of light having a wavelength of 193 nm from the substrate in a three-layer process in which a silicon-containing intermediate layer is used in combination.

[Measurement of Dry Etching Rate]

An etching device and etching gas below were used for measuring the dry etching rate.
Etching device: RIE-10NR (manufactured by SAMCO Inc.)
Etching gas: $CF_4$ Each of the resist underlayer film-forming composition solutions prepared in Example 1 to Example 4 and Comparative Example 1 was applied onto a silicon wafer with a spinner, and was heated on a hot plate at 250° C. for 1 minute to form a resist underlayer film (film thickness: 0.20 μm). The dry etching rate was measured on each resist underlayer film by using $CF_4$ gas as an etching gas. Furthermore, a solution in which 0.7 g of phenol novolak resin was dissolved into 10 g of propylene glycol monomethyl ether was applied onto the silicon wafer with a spinner, and heated at 240° C. for 1 minute to form a phenol novolak resin film. The dry etching rate was measured on the resin film by using $CF_4$ gas as an etching gas, and was compared with the dry etching rate of each resist underlayer film formed from the resist underlayer film-forming compositions of Example 1 to Example 3 and Comparative Example 1. The results are given in Table 2 below. Each dry etching rate ratio (selection ratio) given in Table 2 is a ratio of the dry etching rate of each resist underlayer film to the dry etching rate of the phenol novolak resin film (resist underlayer film)/(phenol novolak resin film).

TABLE 2

|  | Dry etching rate ratio |
| --- | --- |
| Example 1 | 0.82 |
| Example 2 | 0.84 |
| Example 3 | 0.88 |
| Example 4 | 0.85 |
| Comparative Example 1 | 0.78 |

From these results, it is found that each of the resist underlayer films obtained from the resist underlayer film-forming compositions according to the present invention, unlike a conventional anti-reflective coating having a high etching-rate property, has a selection ratio of dry etching rate to the dry etching rate of the photoresist that is close to 1, a smaller selection ratio of dry etching rate to the dry etching rate of the photoresist, or a smaller selection ratio of dry etching rate to the dry etching rate of the semiconductor substrate, further making it possible to provide an excellent coating-type resist underlayer film that can also have an effect as an anti-reflective coating.

INDUSTRIAL APPLICABILITY

The resist underlayer films above can be used as resist underlayer films, used for a lithography process, that have high n values and low k values and can effectively reduce reflection of light having a wavelength of 193 nm from the substrate in a three-layer process in which a silicon-containing intermediate layer is used in combination.

The invention claimed is:

1. A resist underlayer film-forming composition comprising:
   a polymer containing a unit structure including a product obtained by reaction of a condensed heterocyclic compound and a bicyclo ring compound; wherein
   the polymer is a polymer containing a unit structure of Formula (1), a unit structure of Formula (2), a unit structure of Formula (3), or a combination of the unit structures of Formulae (1), (2), and (3):

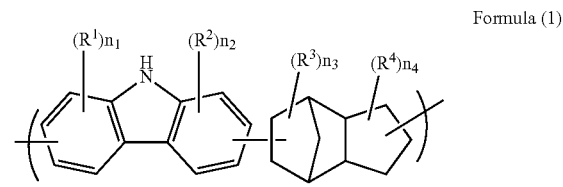

Formula (1)

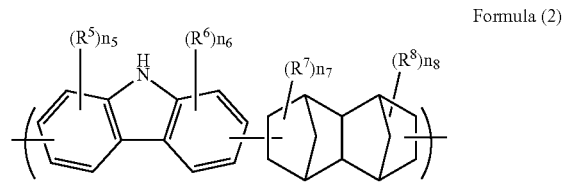

Formula (2)

Formula (3)

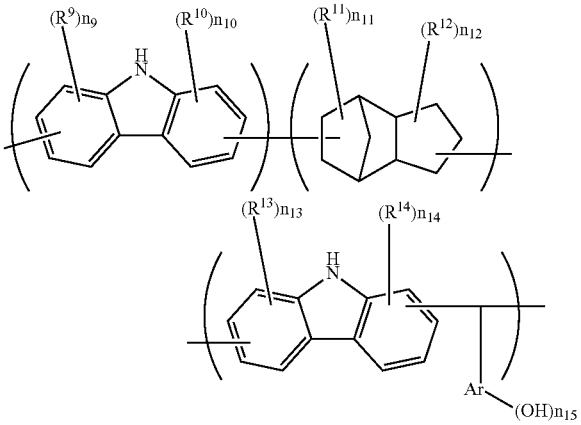

where
   $R^1$ to $R^{14}$ are each a substituent of a hydrogen atom and are each independently a halogen group, a nitro group, an amino group, a hydroxy group, or a $C_{1-10}$ alkyl group for which the groups are optionally substituted or a $C_{6-40}$ aryl group for which the groups are optionally substituted;
   each of $n_1$, $n_2$, $n_5$, $n_6$, $n_9$, $n_{10}$, $n_{13}$, $n_{14}$, and $n_{15}$ is an integer of 0 to 3;
   each of $n_3$, $n_4$, $n_7$, $n_8$, $n_{11}$, and $n_{12}$ is an integer of 0 to 4; and
   in Formula (3) Ar is a phenyl group or a naphthyl group.

2. The resist underlayer film-forming composition according to claim 1, further comprising a cross-linking agent.

3. The resist underlayer film-forming composition according to claim 1, further comprising an acid and/or an acid generator.

4. A resist underlayer film obtained by applying the resist underlayer film-forming composition as claimed in claim 1 onto a semiconductor substrate and baking the resist underlayer film-forming composition.

5. A method for forming a resist pattern used in production of a semiconductor, the method comprising:
applying the resist underlayer film-forming composition as claimed in claim 1 onto a semiconductor substrate and baking the resist underlayer film-forming composition to form a resist underlayer film,
forming a resist film on the resist underlayer film, and
forming a resist pattern by irradiation with light or electron beams and development.

6. A production method of a semiconductor device, the production method comprising:
forming an underlayer film on a semiconductor substrate using the resist underlayer film-forming composition as claimed in claim 1;
forming a resist film on the underlayer film;
forming a resist pattern in the resist film by irradiation with light or electron beams and development;
etching the underlayer film using the resist pattern; and
fabricating the semiconductor substrate using the underlayer film thus patterned.

7. A production method of a semiconductor device, the production method comprising:
forming an underlayer film on a semiconductor substrate using the resist underlayer film-forming composition as claimed in claim 1;
forming a hard mask on the underlayer film;
further forming a resist film on the hard mask;
forming a resist pattern in the resist film by irradiation with light or electron beams and development;
etching the hard mask using the resist pattern;
etching the underlayer film using the hard mask thus patterned; and
fabricating the semiconductor substrate using the underlayer film thus patterned.

8. The production method according to claim 7, wherein the hard mask is formed by application of an inorganic substance solution or deposition of an inorganic substance.

* * * * *